(12) United States Patent
Pergande et al.

(10) Patent No.: US 9,415,519 B2
(45) Date of Patent: Aug. 16, 2016

(54) COMPOSITE END EFFECTOR AND METHOD OF MAKING A COMPOSITE END EFFECTOR

(71) Applicant: Varian Semiconductor Equipment Associates, Inc., Gloucester, MA (US)

(72) Inventors: Paul E. Pergande, Austin, TX (US); Paul Forderhase, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 37 days.

(21) Appl. No.: 14/320,896

(22) Filed: Jul. 1, 2014

(65) Prior Publication Data

US 2016/0001449 A1    Jan. 7, 2016

(51) Int. Cl.
 *B25J 15/00* (2006.01)
 *H01L 21/683* (2006.01)

(52) U.S. Cl.
 CPC .......... *B25J 15/0085* (2013.01); *B25J 15/0014* (2013.01); *B25J 15/0019* (2013.01); *H01L 21/6831* (2013.01); *Y10S 901/30* (2013.01)

(58) Field of Classification Search
 CPC ............... B25J 15/0085; B25J 15/0019; B25J 11/0095; B25J 13/08; B25B 38/0004; H01L 21/6831; H01L 21/6833; Y10S 901/30
 USPC ...................... 294/213, 907; 414/941; 901/47
 See application file for complete search history.

(56) References Cited

U.S. PATENT DOCUMENTS

| 6,199,927 | B1 * | 3/2001 | Shamlou | H01L 21/6838 |
| | | | | 294/185 |
| 8,590,956 | B2 * | 11/2013 | Coady | H01L 21/68 |
| | | | | 294/213 |
| 2003/0035711 | A1 * | 2/2003 | Gilchrist | H01L 21/68707 |
| | | | | 414/744.5 |
| 2007/0209933 | A1 * | 9/2007 | Yoshioka | H01J 37/32431 |
| | | | | 204/298.31 |
| 2007/0247778 | A1 * | 10/2007 | Harb | H01L 21/68 |
| | | | | 361/234 |
| 2010/0178139 | A1 * | 7/2010 | Sundar | H01L 21/6831 |
| | | | | 414/225.01 |
| 2012/0160808 | A1 * | 6/2012 | Kikuchi | H01J 37/32165 |
| | | | | 216/67 |
| 2014/0099485 | A1 * | 4/2014 | Narendrnath | H01L 21/67092 |
| | | | | 428/201 |
| 2014/0209245 | A1 * | 7/2014 | Yamamoto | H01L 21/6831 |
| | | | | 156/345.53 |
| 2014/0301010 | A1 * | 10/2014 | Hayahara | H01L 21/67109 |
| | | | | 361/234 |
| 2015/0134112 | A1 * | 5/2015 | Chen | B25J 9/1697 |
| | | | | 700/254 |
| 2015/0170977 | A1 * | 6/2015 | Singh | H01L 22/12 |
| | | | | 438/16 |
| 2015/0187626 | A1 * | 7/2015 | Parkhe | H01L 21/6833 |
| | | | | 361/234 |

OTHER PUBLICATIONS

Paul E. Perande, et al, Wafer Handling Apparatus, U.S. Appl. No. 13/800,768, filed Mar. 13, 2013.

* cited by examiner

*Primary Examiner* — Gabriela Puig

(57) ABSTRACT

A composite end effector including a lower sandwich panel having a first side and a second side opposite the first side, an upper sandwich panel having a first side and a second side opposite the first side, wherein the first side of the upper sandwich panel is bonded to the first side of the lower sandwich panel, and an intermediate element disposed between the second side of the lower sandwich panel and the second side of the upper sandwich panel. The intermediate element may include an electrical conductor, wherein an electrostatic chuck is electrically coupled to the electrical conductor through an aperture in the upper sandwich panel. Alternatively or additionally, the intermediate element may include a pair of optical fibers disposed within a pair of channels formed in at least one of the first side of the upper sandwich panel and the first side of the lower sandwich panel.

13 Claims, 9 Drawing Sheets

(a-a)

COMPOSITE END EFFECTOR AND METHOD OF MAKING A COMPOSITE END EFFECTOR

FIELD OF THE DISCLOSURE

Embodiments of the present disclosure generally relate to the field of substrate processing, and more particularly to a composite robotic end effector having an intermediate element and a method of making thereof.

BACKGROUND OF THE DISCLOSURE

Silicon substrates are used in the fabrication of semiconductors and solar cells. During such fabrication, the substrates are subjected to a multi-step manufacturing process that may involve a plurality of machines and a plurality of stations. Thus, the substrates need to be transported from one machine/station to another machine/station one or more times.

The transport of the substrates typically employs apparatuses called end effectors. A typical end effector may be a flat platform having a hand-like or claw-like appearance defined by a base unit with a plurality of flat fingers or tines extending therefrom. The fingers may be adapted to support a substrate in a horizontal orientation. During operation, the end effector may typically be moved linearly (e.g., forward and backward) as well as rotationally all in the same plane (e.g., x-y axis). The end effector may also be moved in a third direction along a z-axis to provide a full range of motion. It is generally desirable for end effectors to be formed of materials that are lightweight, that are stiff, and that do not produce contaminants (i.e., particulate matter) during use. It is also generally desirable for end effectors to have working surfaces (i.e., surfaces that engage substrates) that are very flat, hard, and easy to clean. Still further, it is generally desirable for end effectors to be very thin to facilitate insertion between silicon substrates that are stored in a stacked arrangement in close vertical proximity to one another, such as in a front opening unified pod (FOUP) or other storage medium.

It is common for end effectors to be provided with sensors and/or other components that facilitate the loading, unloading, positioning, and/or secure transport of silicon substrates. For example, an end effector may be provided with a photoelectric sensor, such as a through beam sensor, for detecting the presence or absence of substrates in a FOUP or other storage medium from which substrates can be collected for subsequent transport and processing. It is also common for end effectors to be provided with electrostatic chucks ("e-chucks") that are capable of producing electrostatic forces for securely clamping substrates to an end effector during transport and/or processing.

Although sensors and components such as those described above may confer numerous advantages and benefits, they are also associated with a number of drawbacks. For example, the provision of such sensors and components, which are typically mounted on the top and/or bottom surfaces of an end effector, can increase the overall profile and thickness of an end effector. Furthermore, such sensors and components, including associated wiring, connectors, fasteners, etc., create irregularities on the otherwise flat surfaces of an end effector. Such surface irregularities can complicate, and therefore prolong, the cleaning of an end effector, thereby creating undesirable delays during manufacturing processes.

In view of the foregoing, it would be advantageous to provide an end effector having sensors and/or other components that aid in the loading, unloading, positioning, and/or secure transport of substrates, wherein such end effector has substantially flat, easy-to-clean surfaces. It would further be advantageous to provide such an end effector having a very thin profile.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide a method and an apparatus for making a planar end effector. A first exemplary embodiment of a composite end effector accordance with the present disclosure may include a lower sandwich panel having a first side and a second side opposite the first side, an upper sandwich panel having a first side and a second side opposite the first side, wherein the first side of the upper sandwich panel is bonded to the first side of the lower sandwich panel, and an intermediate element disposed between the second side of the lower sandwich panel and the second side of the upper sandwich panel. The intermediate element may include an electrical conductor, wherein an electrostatic chuck is electrically coupled to the electrical conductor through an aperture in the upper sandwich panel. Alternatively or additionally, the intermediate element may include a pair of optical fibers disposed within a pair of channels formed in at least one of the first side of the upper sandwich panel and the first side of the lower sandwich panel.

An exemplary method of making a composite end effector in accordance with the present disclosure may include forming a lower sandwich panel from a first sheet of material, the lower sandwich panel having a first side and a second side opposite the first side, forming an upper sandwich panel from a second sheet of material, the upper sandwich panel having a first side and a second side opposite the first side, disposing an intermediate element between the first side of the lower sandwich panel and the first side of the upper sandwich panel, and bonding the first side of the lower sandwich panel to the first side of the upper sandwich panel. The method may further include forming an aperture in the upper sandwich panel, mounting an electrostatic chuck in the aperture, and coupling the electrostatic chuck to the intermediate element through the aperture, wherein the intermediate element is an electrical conductor. Additionally or alternatively, the method may include forming a first channel in at least one of the first side of the lower sandwich panel and the first side of the upper sandwich panel, and disposing the intermediate element within the channel, wherein the intermediate element is an optical fiber.

BRIEF DESCRIPTION OF THE DRAWINGS

By way of example, various embodiments of the disclosed device will now be described, with reference to the accompanying drawings, in which.

DETAILED DESCRIPTION

Figure 1:
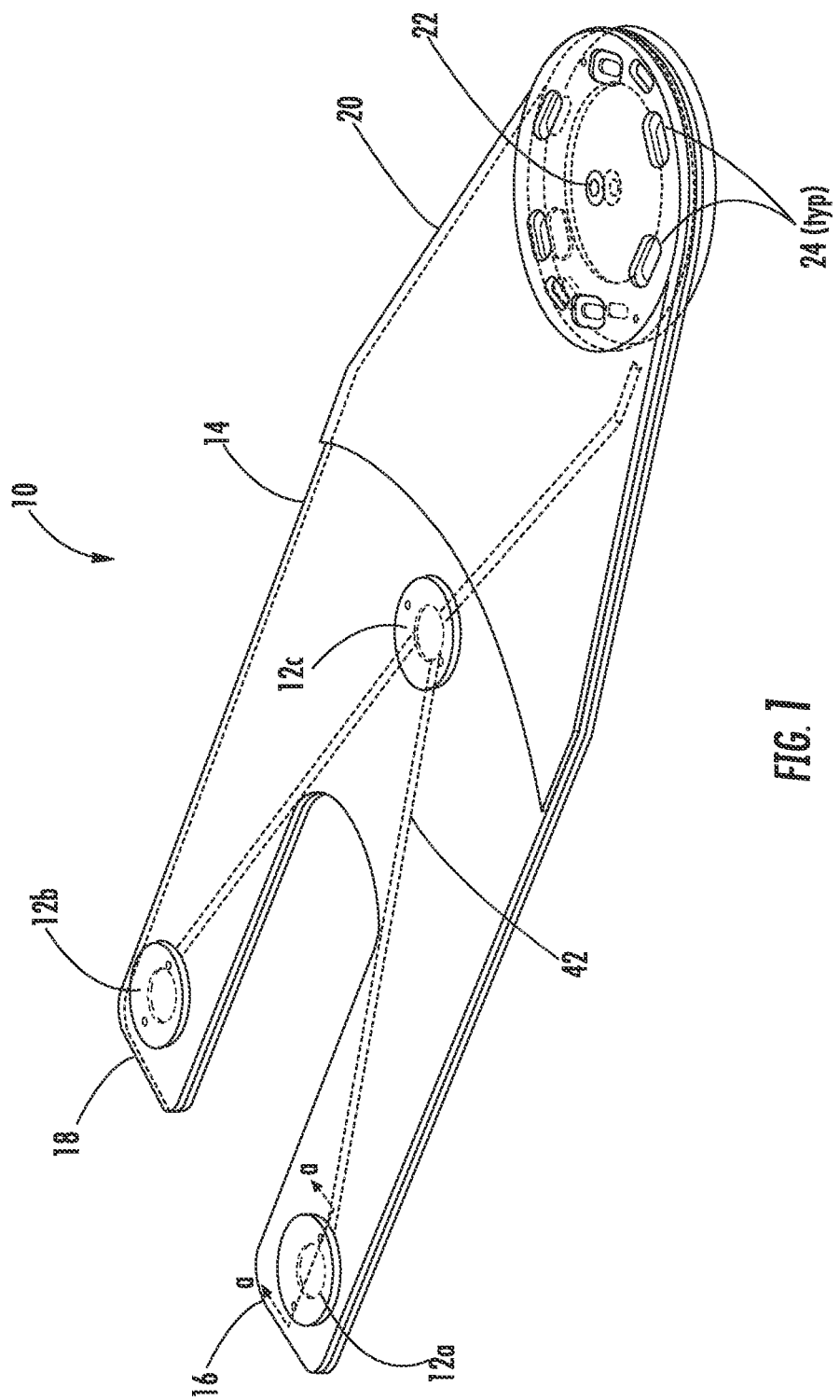
FIG. 1 is an isometric view illustrating a first exemplary embodiment of a composite end effector in accordance with the present disclosure.

A low profile end effector having one or more embedded, intermediate elements in accordance with the present disclosure will now be described more fully hereinafter with reference to the accompanying drawings, in which preferred embodiments of the end effector are shown. The end effector may, however, be embodied in many different forms and should not be construed as being limited to the embodiments set forth herein. Rather, these embodiments are provided so that this disclosure will be thorough and complete, and will fully convey the scope of the end effector to those skilled in the art. In the drawings, like numbers refer to like elements throughout unless otherwise noted.

In accordance with a first exemplary embodiment of the present disclosure, FIG. 1 illustrates a perspective view of a low profile end effector 10 having integrated e-chucks 12a, 12b, 12c. For the sake of convenience and clarity, terms such as "top," "bottom," "upper," "lower," "vertical," "horizontal," "lateral," "longitudinal," "inner," and "outer" may be used herein to describe the relative placement and orientation of the features and components of the end effector 10, each with respect to the geometry and orientation of the end effector 10 as it appears in FIG. 1. Said terminology will include the words specifically mentioned, derivatives thereof, and words of similar import.

The end effector 10 may include a base portion 14 having two fingers 16, 18 extending therefrom, and a wrist portion 20 having a mounting hub 22 and a plurality of mounting apertures 24 that may facilitate attachment of the end effector 10 to a robot or other manipulation device. The end effector 10 may further include e-chucks 12a, 12b, 12c that may be partially integrated into the fingers 16, 18 and in the base portion 14, respectively, as further described below. It will be understood that the particular configuration of the end effector 10 shown in FIG. 1 is provided by way of example only, and that many other configurations may be similarly implemented without departing from the present disclosure. For example, alternative end effector designs may include only one finger or more than two fingers with corresponding integrated e-chucks.

Figure 2:
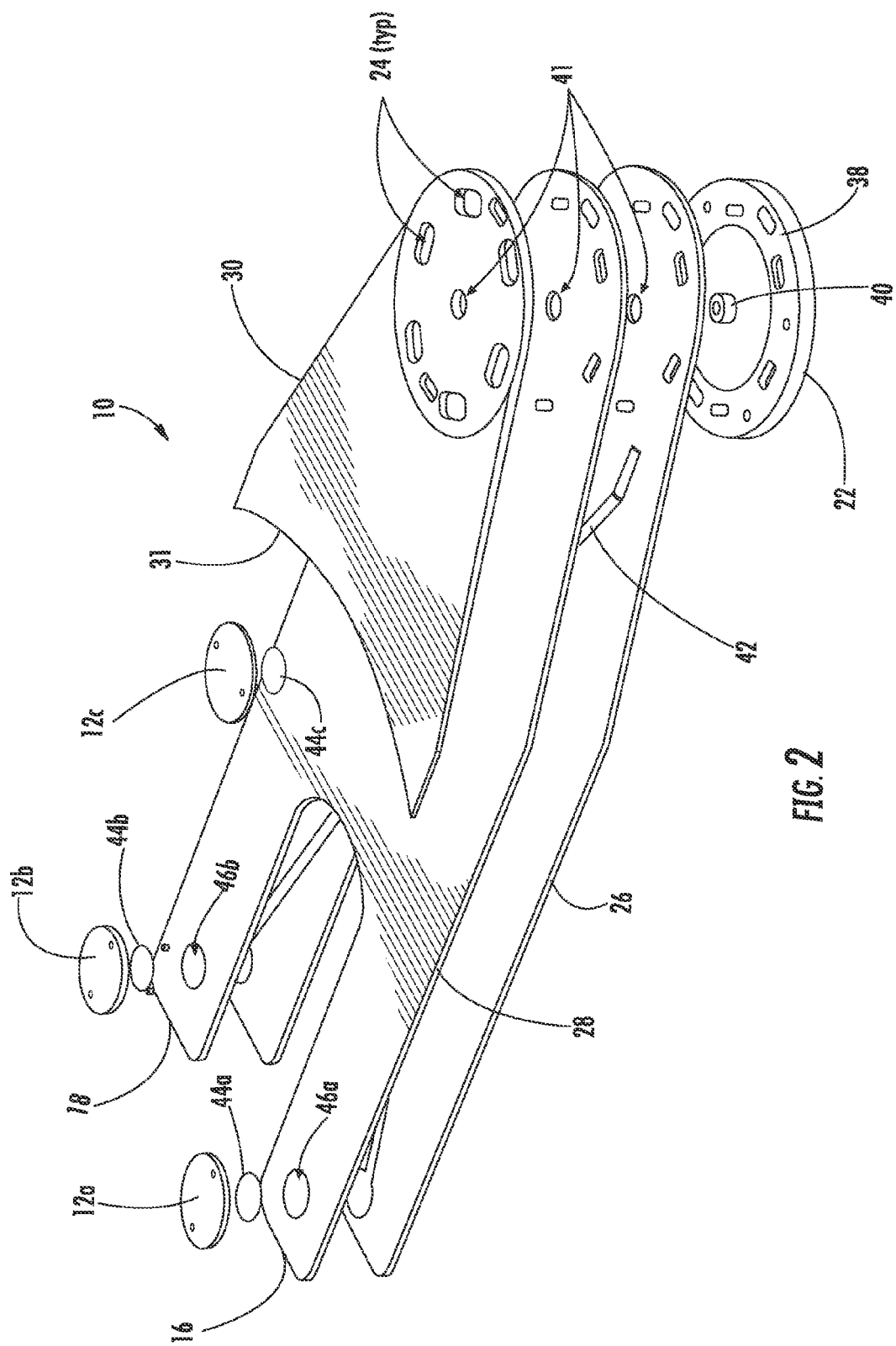
FIG. 2 is an exploded view illustrating the composite end effector shown in FIG. 1.

Referring to FIG. 2, the end effector may be formed of a lower sandwich panel 26, an upper sandwich panel 28, and a ridigizing panel 30 that may be bonded together in a stacked, flatly-abutting arrangement as further described below. The lower sandwich panel 26 and the upper sandwich panel 28 may, in some embodiments, be substantially identical and may define the full footprint of the end effector 10 (i.e., the base portion 14, the fingers 16, 18, and the wrist portion 20 shown in FIG. 1). The rigidizing panel 30 may only include the wrist portion 20 and a rear part of the base portion 14 of the end effector 10 footprint. Thus, a forward portion of the end effector 10, including the fingers 16, 18 and a forward part of the base portion 14, may be relatively thin for facilitating insertion between substrates (not shown) stored in a stacked arrangement in close vertical proximity to one another, such as in a front opening unified pod (FOUP) or other storage medium. The rear portion of the end effector 10, including the wrist portion 20 and a rear part of the base portion 14, may be relatively thick for providing the end effector 10 with rigidity and support. A front edge 31 of the rigidizing panel 30, which in the illustrated embodiment includes a concave contour, may be contoured so as not to interfere with substrates that are supported on the forward portion of the end effector 10. Alternative embodiments of the end effector 10 are contemplated in which the rigidizing panel 30 is entirely omitted.

The lower sandwich panel 26, upper sandwich panel 28, and ridigizing panel 30 may be formed of any suitably rigid, lightweight, non-contaminating material. For example, the lower sandwich panel 26, upper sandwich panel 28, and ridigizing panel 30 may be formed of a carbon fiber composite (CFC). Other materials that may additionally or alternatively be used in the construction of the end effector 10 include, but are not limited to, aluminum, quartz, and ceramic.

The mounting hub 22 may include a base portion 38 that flatly engages a lower surface of the lower sandwich panel 26, and may further include a mounting pin 40 that extends through vertically-aligned through holes 41 in the lower sandwich panel 26, upper sandwich panel 28, and ridigizing panel 30. The mounting apertures 24 in the wrist portion 20 of the end effector 10 may extend through each of the lower sandwich panel 26, the upper sandwich panel 28, the ridigizing panel 30, and the mounting hub 22. It will be appreciated by those of ordinary skill in the art that the arrangement and configuration of the mounting hub 22 and/or the mounting apertures 24 can be varied without departing from the present disclosure.

The e-chucks 12a, 12b, 12c of the of the end effector 10 may be operatively connected to an electrical conductor 42 (best shown in ghost dashed lines in FIG. 1) that may be sandwiched between the lower sandwich panel 26 and the upper sandwich panel 28 as further described below. In the illustrated embodiment, the electrical conductor may be a substantially planar, ribbon-like flex circuit. However, it is contemplated that the electrical conductor 42 may be any type of conductor capable of being disposed intermediate the lower sandwich panel 26 and the upper sandwich panel 28 without interfering with a substantially flat bond therebetween and without interfering with the planarity of the overall end effector 10. In an alternative embodiment, it is contemplated the electrical conductor 42 may be partially or entirely disposed within a complimentary channel (not shown) formed in the lower sandwich panel 26 and/or in the upper sandwich panel 28. Since the electrical conductor 42 is disposed intermediate or within the lower sandwich panel 26 and upper sandwich panel 28, the electrical conductor 42 may be referred to generically as an "intermediate element" in the context of the present disclosure.

Figure 5:
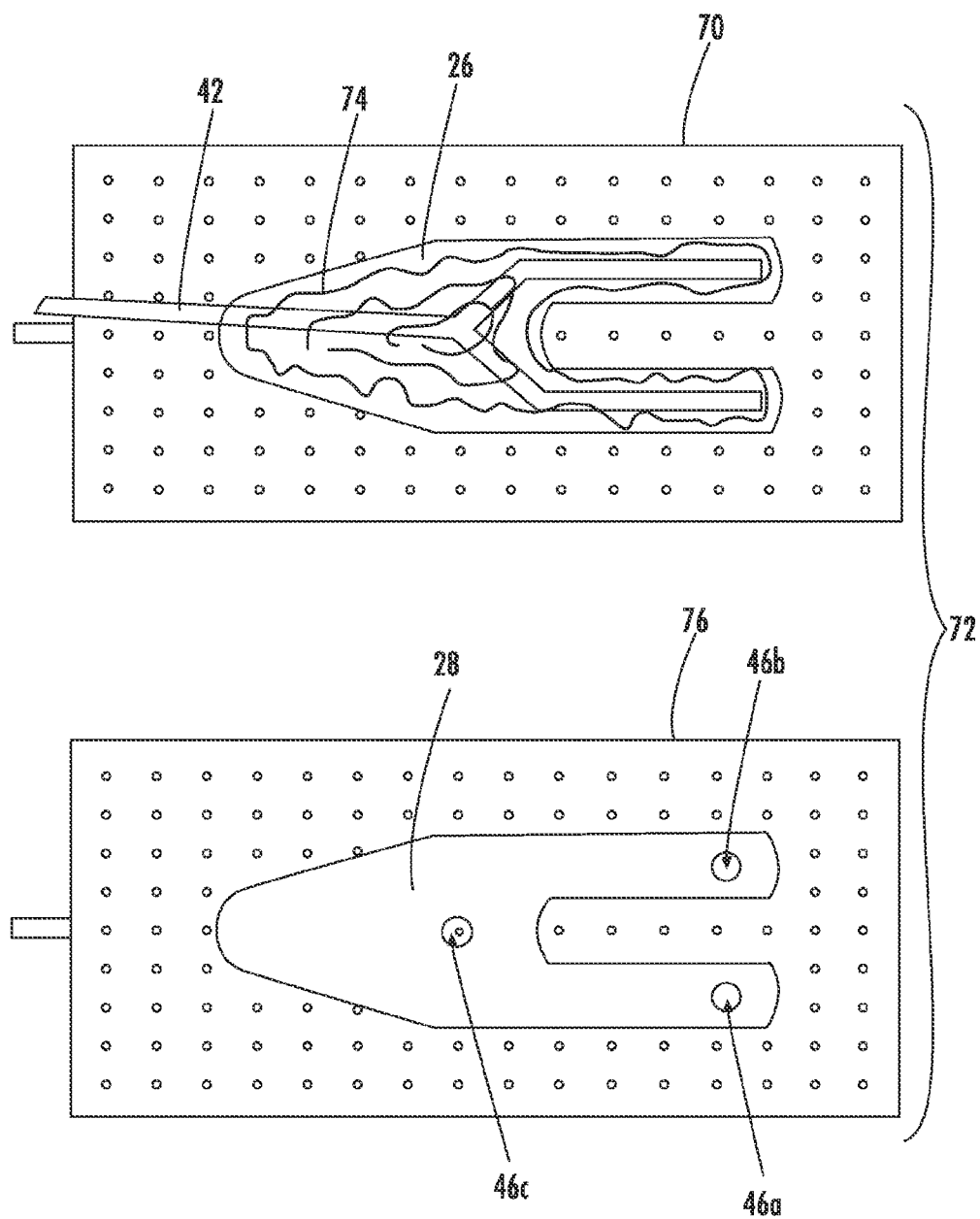
FIG. 5 is a plan view illustrating the lower sandwich panel and the upper sandwich panel of the composite end effector shown in FIG. 1 disposed on respective mold halves of a vacuum jig.

The e-chucks 12a, 12b, 12c may be connected to the electrical conductor 42 via electrical connectors 44a, 44b, 44c that may be disposed within respective apertures 46a, 46b, 46c formed in the upper sandwich panel 28 (aperture 46c is visible in FIG. 5). In one non-limiting example, the electrical connectors 44a, 44b, 44c may be elastomeric electrical connectors sold by Fujipoly Corporation under the trade name ZEBRA. In a contemplated alternative embodiment of the end effector 10, the electrical connectors 44a, 44b, 44c may be omitted and the e-chucks 12a, 12b, 12c may be connected directly to the electrical conductor 42.

The electrical connectors 44a, 44b, 44c may be seated on respective portions of the electrical conductor 42. The electrical conductor 42 may be connected to an electrical power source (not shown) and may deliver electrical power to the e-chucks 12a, 12b, 12c via the electrical connectors 44a, 44b, 44c, such as during operation of the e-chucks 12a, 12b, 12c. The e-chucks 12a, 12b, 12c may thereby produce respective electromagnetic fields that may "clamp" a substrate to the end effector 10 in a manner that will be familiar to those of ordinary skill in the art. While the e-chucks 12a, 12b, 12c, electrical connectors 44a, 44b, 44c, and apertures 46a, 46b, 46c are shown as being circular in shape, it is contemplated that shapes of one or more of the e-chucks 12a, 12b, 12c, electrical connectors 44a, 44b, 44c, and apertures 46a, 46b, 46c can be varied without departing from the present disclosure. Moreover, while three e-chucks 12a, 12b, 12c are shown, it is contemplated that greater or fewer numbers of e-chucks can be used.

Figure 3:
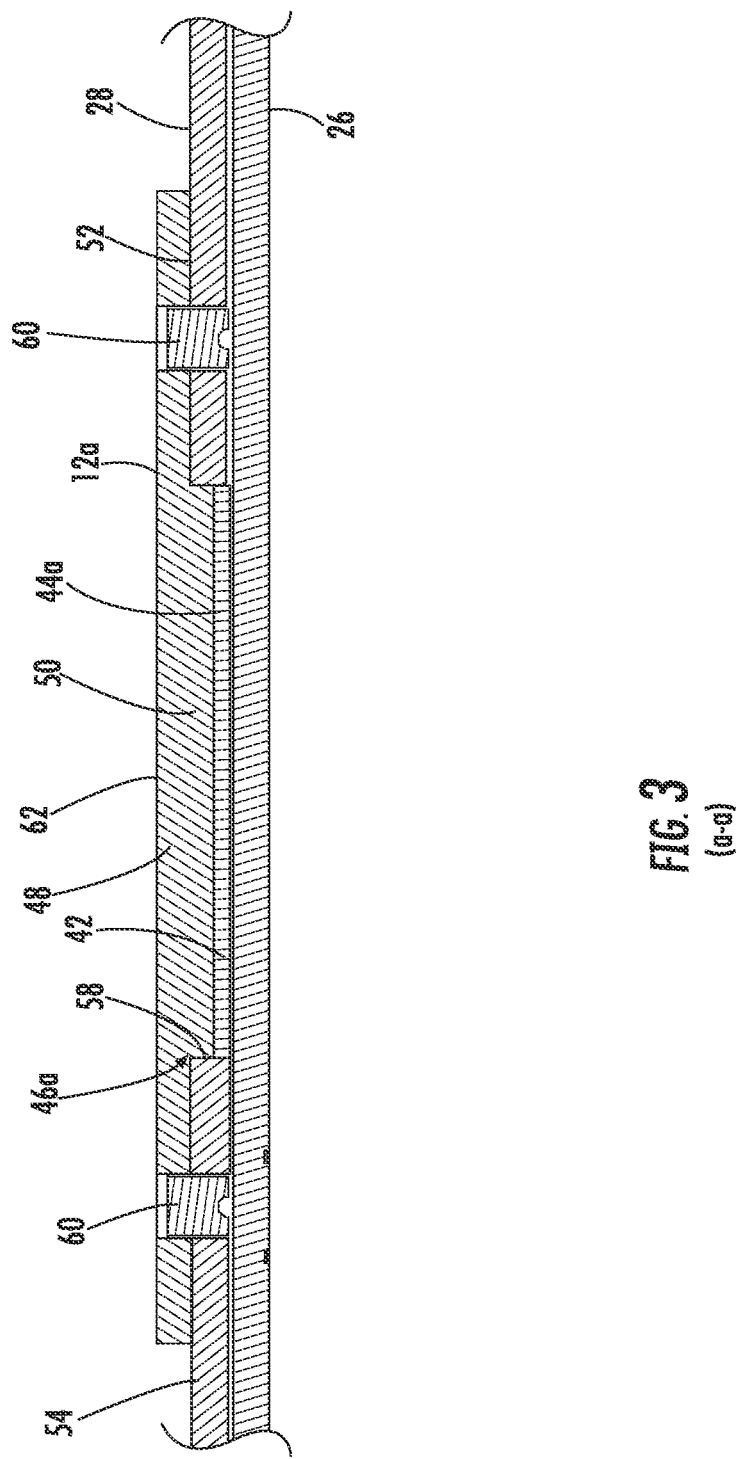
FIG. 3 is a cross sectional view of an e-chuck, electrical connector, and surrounding structures taken along line a-a in FIG. 1.

Referring to FIG. 3, a detailed cross section view illustrating the e-chuck 12a, the electrical connector 44a, and the associated portions of the electrical conductor 42, lower sandwich panel 26, and upper sandwich panel 28 is shown. The features and arrangement of e-chucks 12b, 12c, electrical connectors 44b, 44c, and associated portions of the electrical conductor 42, lower sandwich panel 26, and upper sandwich panel 28 are substantially identical to the configuration and features of the e-chuck 12a, electrical connector 44a, and associated portions of the electrical conductor 42, lower sandwich panel 26, and upper sandwich panel 28. It will therefore be understood that the following description of the features and arrangement of the e-chuck 12a, electrical connector 44a, and associated portions of the electrical conductor 42, lower sandwich panel 26, and upper sandwich panel 28 shall also apply to the features and arrangement of the e-chucks 12b, 12c, electrical connectors 44b, 44c, and associated portions of the electrical conductor 42, lower sandwich panel 26, and upper sandwich panel 28.

The e-chuck 12a may include a disc-shaped support portion 48 and a cylindrical neck portion 50 of smaller diameter extending from the bottom of the support portion 48. The lower surface 52 of the support portion 48 may be seated atop the upper surface 54 of the upper sandwich panel 26 in flat engagement therewith, and the neck portion 50 may extend into the aperture 46a. The neck portion 50 may be disposed in a radially close-clearance relationship with the circular inner edge 58 of the upper sandwich panel 28 that defines that aperture 46a. The e-chuck 12a may be fastened to the upper sandwich panel 28 and, optionally, to the lower sandwich panel 26, such as with removable mechanical fasteners 60 (e.g., screws). The fasteners 60 may be countersunk as shown in FIG. 3 so as not to protrude from the upper surface 62 of the e-chuck 12a, thereby preserving the planarity of the upper surface 62. The removable fasteners 60 may facilitate convenient removal and replacement of the e-chuck 12a, such as for repair, cleaning, or replacement. Alternatively, it is contemplated that the e-chuck 12a may be adhered to the upper sandwich panel 28.

The electrical conductor 42 may be sandwiched between the lower sandwich panel 26 and the upper sandwich panel 28 and may extend below the aperture 46a. The electrical connector 44a may be sandwiched between, and may be in intimate contact with, the electrical conductor 42 and the neck portion 50 of the e-chuck 12a. The electrical connector 44a may thereby provide an electrical connection between the electrical conductor 42 and the e-chuck 12a as described above.

Figure 4:
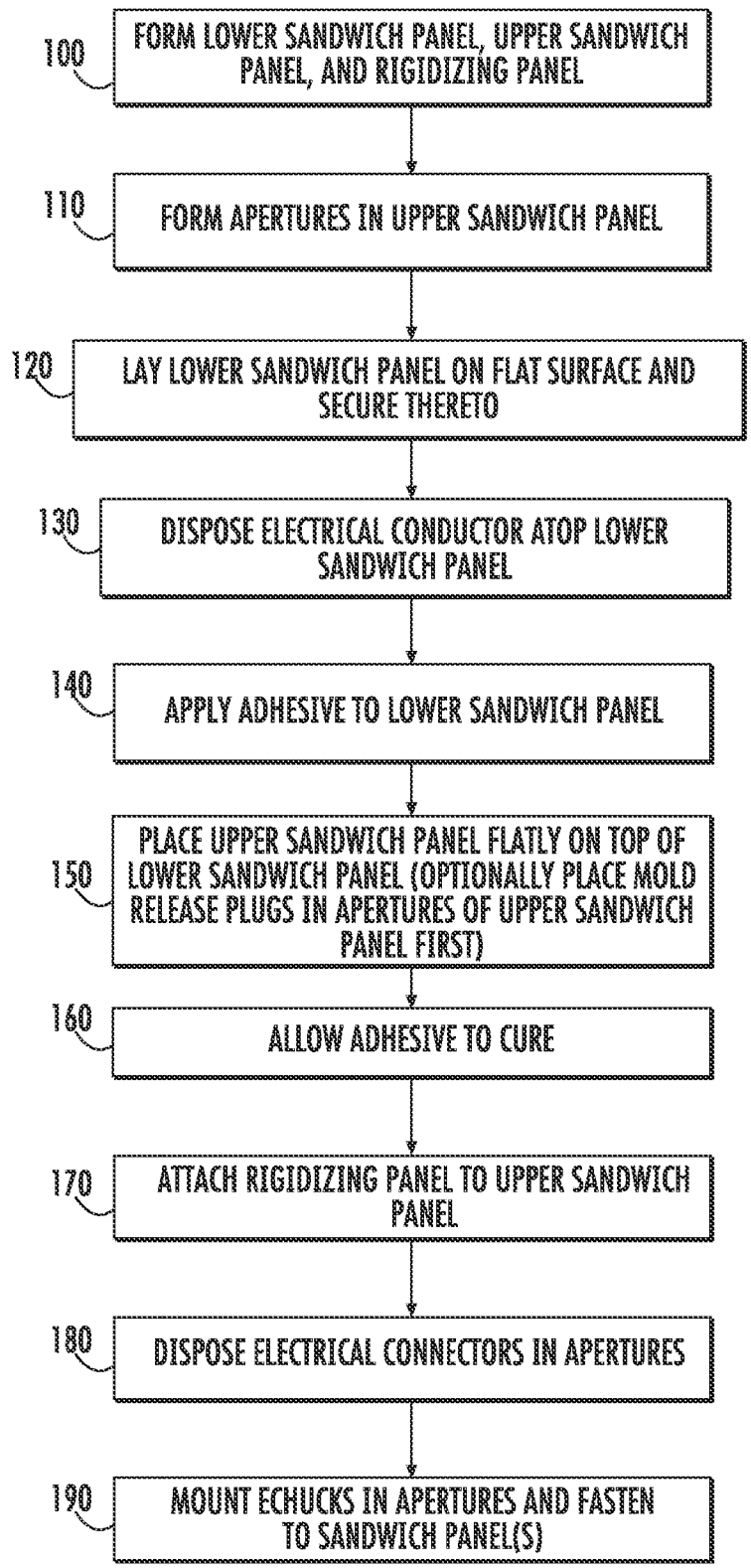
FIG. 4 is a flow diagram illustrating an exemplary method of making the composite end effector shown in FIG. 1.

Referring to FIG. 4, a flow diagram illustrating an exemplary method for constructing the end effector 10 in accordance with the present disclosure is shown. The method will now be described in detail in conjunction with the end effector 10 shown in FIGS. 1-3.

At step 100 of the exemplary method, the lower sandwich panel 26, upper sandwich panel 28, and rigidizing panel 30 may be cut or otherwise formed from one or more sheets of suitable material, including, but not limited to, CFC, aluminum, quartz, and ceramic. In one embodiment of the method, the sheets from which the lower sandwich panel 26, upper sandwich panel 28, and rigidizing panel 30 are cut may be formed of CFC sheets that are produced using a "vacuum-bagging" technique that may provide each of the lower sandwich panel 26, upper sandwich panel 28, and rigidizing panel 30 with a first, relatively rough side, and an second, relatively smooth side. The term "rough" is defined herein to mean one or more of uneven, irregular, not smooth, not flat, textured, pitted, etc. In other embodiments of the method, one or more of the lower sandwich panel 26, upper sandwich panel 28, and rigidizing panel 30 may be produced using processes which provide them with first and second sides that are both smooth.

At step 110 of the exemplary method, the apertures 46a, 46b, 46c may be cut, drilled, milled, or otherwise formed in the upper sandwich panel 28. Apertures for accepting the fasteners 60 may also be similarly formed in the upper sandwich panel 28 and, optionally, in the lower sandwich panel 26.

At step 120 of the exemplary method, the lower sandwich panel 26 may be laid on a flat surface, such as a table top, floor, or other flat work surface. In one embodiment of the method, the flat surface may be a bottom mold half 70 of a vacuum jig 72 as shown in FIG. 5. If the lower sandwich panel 26 has a rough first side and a smooth second side as described above, the lower sandwich panel 26 may be disposed on the flat surface with the smooth second side facing down and the rough first side facing up. The lower sandwich panel 26 may optionally be temporarily secured to the flat surface in a desired orientation, such as with tape and/or other fasteners or adhesives which, if using the vacuum jig 72, may seal the lower sandwich panel 26 to the bottom mold half 70 so that a vacuum can effectively be established therebetween. If a vacuum jig is not used, the sandwich panel 26 may be flatly secured to a flat surface using a temporary, secondary adhesive, such as any low-strength bonding agent, including, but not limited to, fugitive adhesive or pressure sensitive adhesive. Alternatively, it is contemplated that the lower sandwich panel 26 may be flatly secured to a flat surface using a film that is treated with a low-tack, pressure sensitive adhesive. Still further, it is contemplated that the lower sandwich panel 26 may be flatly secured to a flat surface using a primary adhesive of a reactive nature, such as a high-density, high-strength polyurethane foam consisting of two precursors. During curing, these precursors may react and increase in volume, thereby forcibly "sandwiching" the flatly-abutting lower sandwich panel 26 and upper sandwich panel 28 together and keeping them flat while they are bonded together as further described below.

At step 130 of the exemplary method, the electrical conductor 42 may be disposed atop the lower sandwich panel 26 in a desired position and orientation, such as with portions of the electrical conductor 42 extending along areas on the lower sandwich panel 26 that correspond to portions of the upper sandwich panel 28 in which the apertures 46a, 46b, 46c are formed. At step 140 of the method, an amount of adhesive 74 may be applied to the lower sandwich panel 26. The adhesive 74 may be any appropriate adhesive, a non-limiting example of which is a flow-modified epoxy. In an alternative embodiment of the method, the adhesive 74 may be applied to the lower sandwich panel 26 before the electrical conductor 42 is disposed atop the lower sandwich panel 26.

At step 150 of the exemplary method, the upper sandwich panel 28 may be flatly placed on top of the adhesive-covered lower sandwich panel 26 and electrical conductor 42. In one exemplary embodiment of the method, mold-release plugs may be placed in the apertures 46a, 46b, 46c of the upper sandwich panel 28 before the upper sandwich panel is placed on top of the lower sandwich panel 26 to prevent the adhesive 74 from flowing into the apertures 46a, 46b, 46c when the adhesive 74 is compressed between the lower sandwich panel 26 and the upper sandwich panel 28. Such mold-release plugs can be removed from the apertures 46a, 46b, 46c after the adhesive 74 has cured.

If the lower sandwich panel 26 and the upper sandwich panel 28 each have a rough first side and a smooth second side as described above, the upper sandwich panel 28 may be placed on top of the lower sandwich panel 26 with the rough first side of the upper sandwich panel 28 facing down and with the smooth second side of the upper sandwich panel 28 facing up. The rough first sides of the lower sandwich panel 26 and upper sandwich panel 28 may thereby be disposed in a confronting relationship and separated by the adhesive 74.

In one embodiment of the method, the lower sandwich panel 26 and upper sandwich panel 28 may be stacked and adhered in the above-described manner using the vacuum jig 72 shown in FIG. 5. For example, the smooth second side of the lower sandwich panel 26 may be vacuum sealed flatly against the bottom mold half 70 of the vacuum jig 72 and the smooth second side of the upper sandwich panel 28 may be vacuum sealed flatly against the top mold half 76 of the vacuum jig 72. The top mold half 76 may then be inverted and lowered onto the bottom mold half 70.

At step 160 of the exemplary method, the adhesive 74 between the lower sandwich panel 26 and the upper sandwich panel 28 may be allowed to cure while the lower sandwich panel 26 and the upper sandwich panel 28 are held a short, fixed distance apart from one another, forming a so-called "bond-gap" therebetween that is mostly filled with adhesive, and with the outwardly-facing, non-confronting sides (e.g., the smooth second sides) of the lower sandwich panel 26 and the upper sandwich panel 28 held in a substantially parallel relationship with one another. In one embodiment, the lower sandwich panel 26 and the upper sandwich panel 28 may be held in this manner using the above-described jig 72. For example, with the lower sandwich panel 26 and the upper sandwich panel 28 vacuum sealed to the bottom and top mold halves 70, 76 and stacked so that the rough first sides of the lower sandwich panel 26 and the upper sandwich panel 28 are disposed in a confronting relationship as described above, one or more spacers or "gap blocks" of substantially identical height may be interposed between the bottom and top mold halves 70, 76. Such gap blocks may have a height that maintains the mold halves 70, 76 a specified, uniform distance apart so that the resulting end effector 10 has a desired predetermined thickness.

Since the smooth second sides of the lower sandwich panel 26 and the upper sandwich panel 28 were held in a parallel relationship and the rough first sides of the lower sandwich panel 26 and the upper sandwich panel 28 were held apart from one another during curing of the adhesive 74, the end effector 10 may be highly planar (i.e., having parallel top and bottom surfaces), with any surface irregularities of the rough first sides of the lower sandwich panel 26 and the upper sandwich panel 28 having been "absorbed" by the adhesive 74 during curing. That is, the surface irregularities of the confronting, rough first sides may not affect the planarity of the end effector 10 as they otherwise might if the rough first sides were placed in direct contact with one another (i.e., with no bond-gap therebetween), with their respective surface irregularities engaging each other.

At step 170 of the exemplary method, the rigidizing layer 30 may be adhered to the top of the upper sandwich panel 28 in the arrangement shown in FIG. 1, such as with a flow-modified epoxy. Alternatively, the rigidizing panel 30 may be secured to the upper sandwich panel 28 with mechanical fasteners. At step 180 of the method, the mounting apertures 24 may be cut, drilled, milled, or otherwise formed in the assembled lower sandwich panel 26, upper sandwich panel 28, and rigidizing panel 30 and the mounting hub 22 may be installed in the arrangement shown in FIGS. 1 and 2.

At step 180 of the exemplary method, the electrical connectors 44a, 44b, 44c may be seated in the respective apertures 46a, 46b, 46c in the upper sandwich panel 28 in flat, operative engagement with respective portions of the electrical conductor 42. At step 190 of the method, the neck portions 50 of the e-chucks 12a, 12b, 12c may be mounted in the apertures 46a, 46b, 46c in engagement with the electrical connectors 44a, 44b, 44c, and the support portions 48 of the e-chucks 12a, 12b, 12c may be fastened to the upper sandwich panel 28 and, optionally, to the lower sandwich panel 26 as best illustrated in FIG. 3 with respect to the e-chuck 12a.

Owing to the high-planarity of the assembled lower sandwich panel 26 and upper sandwich panel 28, the completed end effector 10 may also be highly planar. Moreover, since the top and bottom surfaces of the end effector 10 may be formed of the smooth second sides of the upper sandwich panel 28 and lower sandwich panel 26, the major surfaces of the end effector 10 may be smooth and ultra-flat (e.g. less than about 0.005 inches of variation over about 24 inches of surface). Thus, the end effector 10 may be very light, very stiff, and not prone to generating, trapping, or distributing contaminants (i.e., particulate matter) during substrate handling processes. Moreover, since the electrical conductor 42 and the electrical connectors 44a, 44b, 44c are embedded within the end effector 10, the end effector 10 may have a slim profile and an exterior of the end effector 10 may be relatively smooth and regular, thus facilitating convenient and expeditious cleaning thereof.

Figure 6:
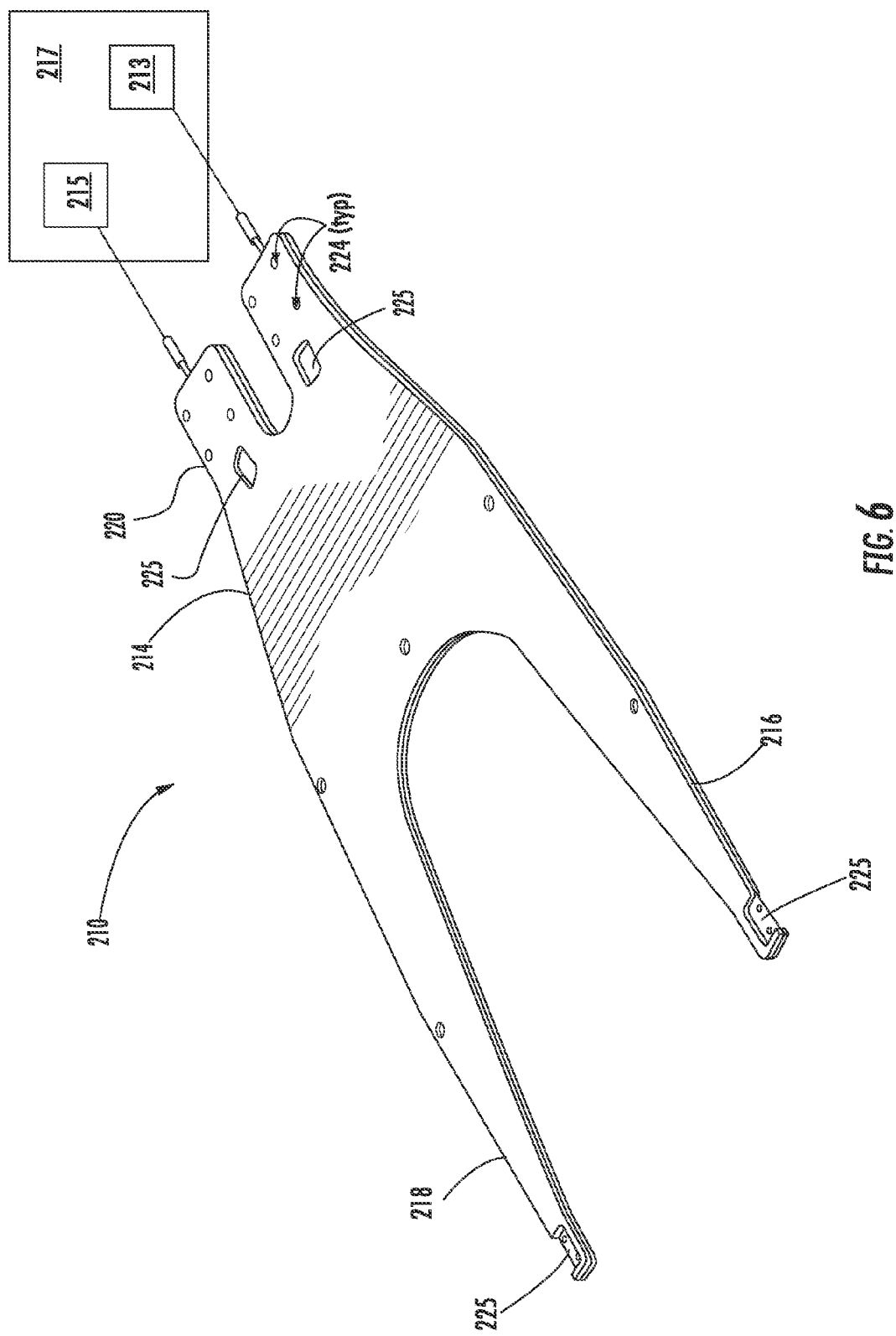
FIG. 6 is an isometric view illustrating a second exemplary embodiment of a composite end effector in accordance with the present disclosure.

Referring now to FIG. 6, another exemplary end effector 210 in accordance with an embodiment of the present disclosure is shown. For the sake of convenience and clarity, terms such as "top," "bottom," "upper," "lower," "vertical," "horizontal," "lateral," "longitudinal," "inner," and "outer" may be used herein to describe the relative placement and orientation of the features and components of the end effector 10, each with respect to the geometry and orientation of the end effector 10 as it appears in FIG. 6. Said terminology will include the words specifically mentioned, derivatives thereof, and words of similar import.

The end effector 210 may be similar to the end effector 210 described above and may include a base portion 214 having two fingers 216, 218 extending therefrom, and a wrist portion 220 having a plurality of mounting apertures 224 that may facilitate attachment of the end effector 210 to a robot or other device. A plurality of pockets or recesses 225 may be formed in a top surface of the end effector 210 for holding effector pads (not shown) that may engage and support substrates. The end effector 10 may further include embedded optical fibers 212a, 212b (see FIG. 7) that may be connected to a photo emitter 213 and a photo sensor 215, respectively, of a through beam sensor 217 (schematically shown in FIG. 6), as described in greater detail below. It will be understood that the particular configuration of the end effector 210 shown in FIG. 6 is provided by way of example only, and that many other configurations may be similarly implemented without departing from the present disclosure. For example, alternative end effector designs may include only one finger or more than two fingers with positions of the optical fibers 212a, 212b adjusted accordingly.

Referring to the exploded view of the end effector 210 shown in FIG. 7, the end effector 210 may be formed of a lower sandwich panel 226 and an upper sandwich panel 228 that may be bonded together in a stacked, flatly-abutting arrangement as further described below. The lower sandwich panel 226 and upper sandwich panel 228 may be formed of any suitably rigid, lightweight, non-contaminating material. For example, the lower sandwich panel 226 and upper sandwich panel 228 may be formed of a carbon fiber composite (CFC). Other materials that may additionally or alternatively be used in the construction of the end effector 210 include, but are not limited to, aluminum, quartz, and ceramic.

Figure 9:
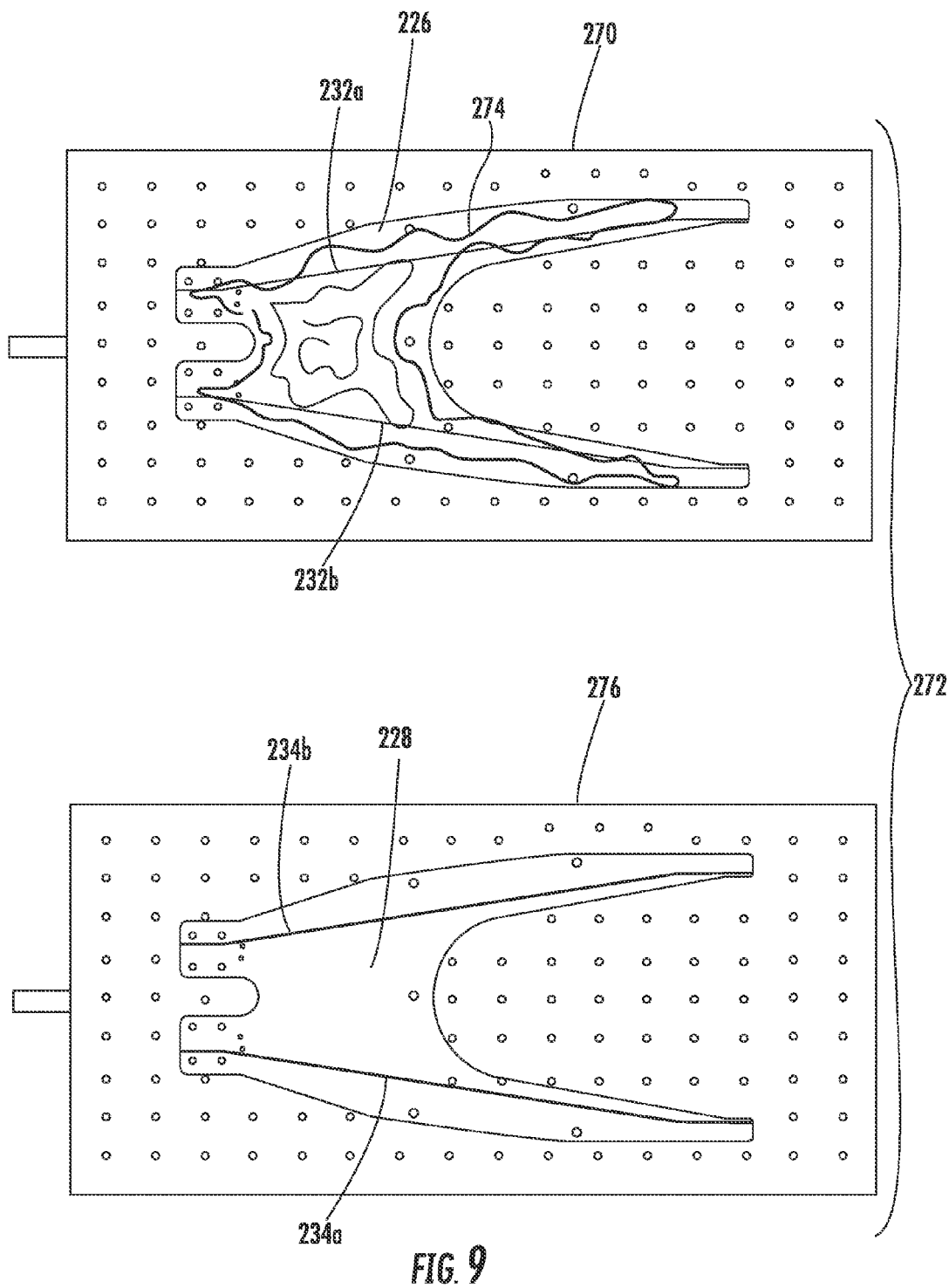
FIG. 9 is a plan view illustrating the lower sandwich panel and the upper sandwich panel of the composite end effector shown in FIG. 6 disposed on respective mold halves of a vacuum jig.

A pair of tubular conduits 230a, 230b may be sandwiched between the lower sandwich panel 226 and the upper sandwich panel 228 in a substantially longitudinally-extending orientation and may be disposed within respective channels 232a, 232b and 234a, 234b (channels 232b and 234b are shown in FIG. 9) that may be formed in the confronting surfaces of the lower sandwich panel 226 and the upper sandwich panel 228. The conduits 230a, 230b may be formed of any suitably durable material, including, but not limited to, stainless steel, polyethylene, or various other metals, plastic, or composites. The channels 232a, 232b and 234a, 234b may each have a size and shape that are adapted to hold the conduits 230a, 230b in a closely conforming relationship therein, thereby restricting radial movement of the conduits within the channels 232a, 232b and 234a, 234b. In an alternative embodiment of the end effector 210, it is contemplated that only one of the lower sandwich panel 226 and the upper sandwich panel 228 may have channels formed in the confronting surface thereof, wherein such channels may have a size and a shape that are adapted to hold the entirety of the conduits 230a, 230b, and that the other of the lower sandwich panel 226 and the upper sandwich panel 228 may have no channels formed in the confronting surface thereof. Owing to the recessing of the conduits 230a, 230b within the channels 232a, 232b and 234a, 234b, the lower sandwich panel 226 and the upper sandwich panel 228 may be flatly bonded together (as shown in FIG. 6) with the conduits 230a, 230b unobtrusively embedded therebetween, thereby providing the end effector 210 with a slim profile.

Figure 7:
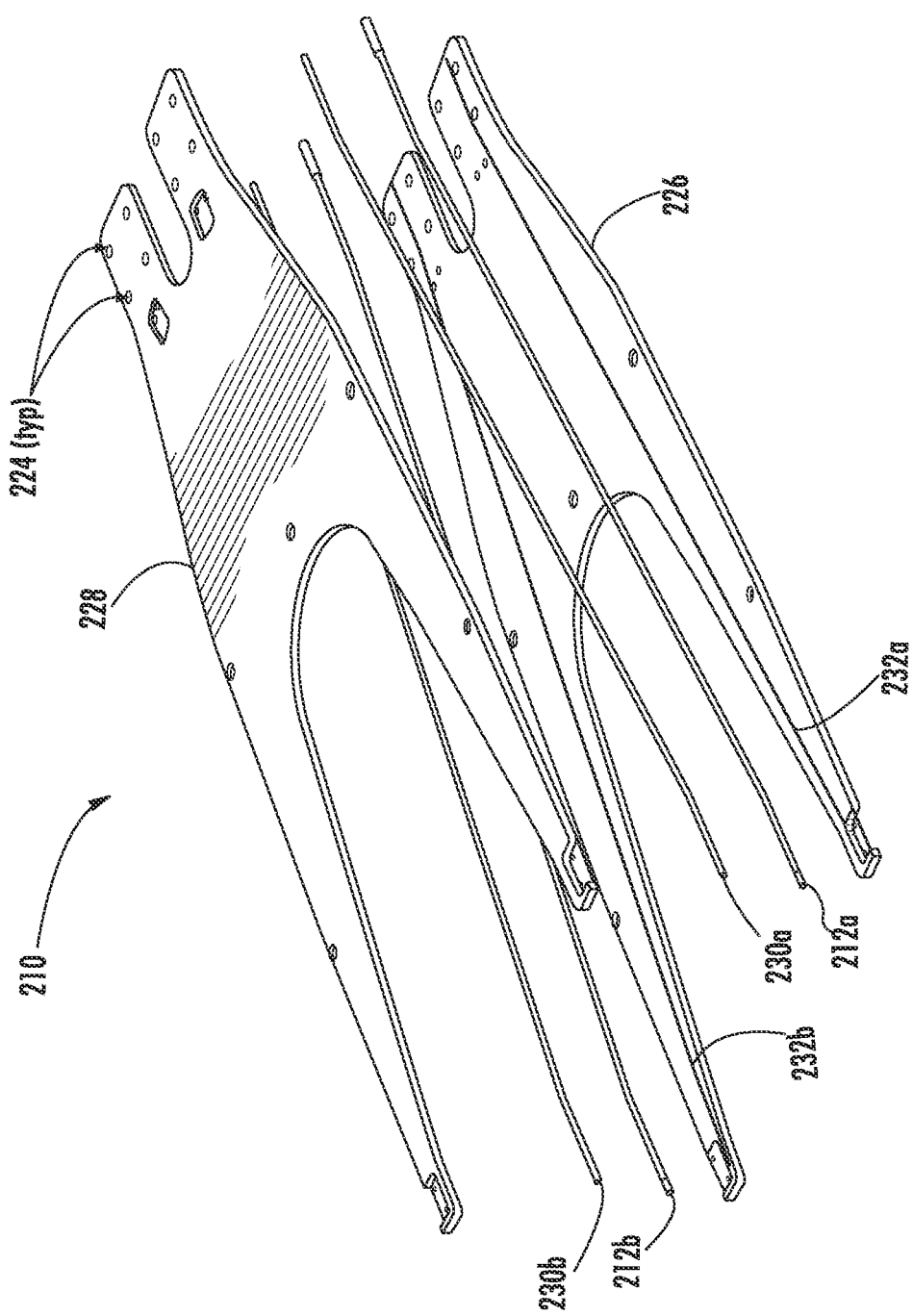
FIG. 7 is an exploded view illustrating the composite end effector shown in FIG. 6.

The optical fibers 212a, 212b may be disposed within the conduits 230a, 230b, respectively (the optical fibers 212a, 212b are shown outside of the conduits 230a, 230b in FIG. 7 for clarity), with the front tips of the optical fibers 212a, 212b exposed adjacent the front edges of the respective fingers 216, 218 and directed forward. As described above, the optical fibers 212a may be connected to a photo emitter 213 and the optical fibers 212b may be connected to a photo sensor 215 (shown in FIG. 6), such as via a harness or other appropriate connection (not shown) at the rear of the end effector. The optical fibers 212a may therefore project light produced by the light emitter 213 toward the optical fibers 212b at the tip of the finger 218. The received light may be conveyed to the photo sensor 215 and may be used, in combination with a known position and orientation of the end effector 210, to determine the presence or absence of the object in front of the end effector 210. For example, the projected and received light may be used to determine the presence or absence of substrates at various vertical positions within a FOUP. Since the electrical conductor 42 is disposed intermediate or within the lower sandwich panel 226 and/or the upper sandwich panel 228, the optical fibers 212a, 212b may be referred to generically as an "intermediate elements" in the context of the present disclosure.

If one or both of the optical fibers 212a, 212b needs to be replaced, they may simply be disconnected from the photo emitter 213 and/or the photo sensor 215 and may be withdrawn from one of the longitudinal ends of the conduits 230a, 230b, respectively. New optical fibers may then be inserted into the conduit 230a and/or the conduit 230b. The optical fibers 212a, 212b may therefore be quickly and conveniently replaced without disassembling the end effector 210. In an alternative embodiment of the end effector 210, it is contemplated that the conduits 230a, 230b may be omitted and that the optical fibers 212a, 212b may be disposed directly within the respective channels 232a, 232b and 234a, 234b.

Figure 8:
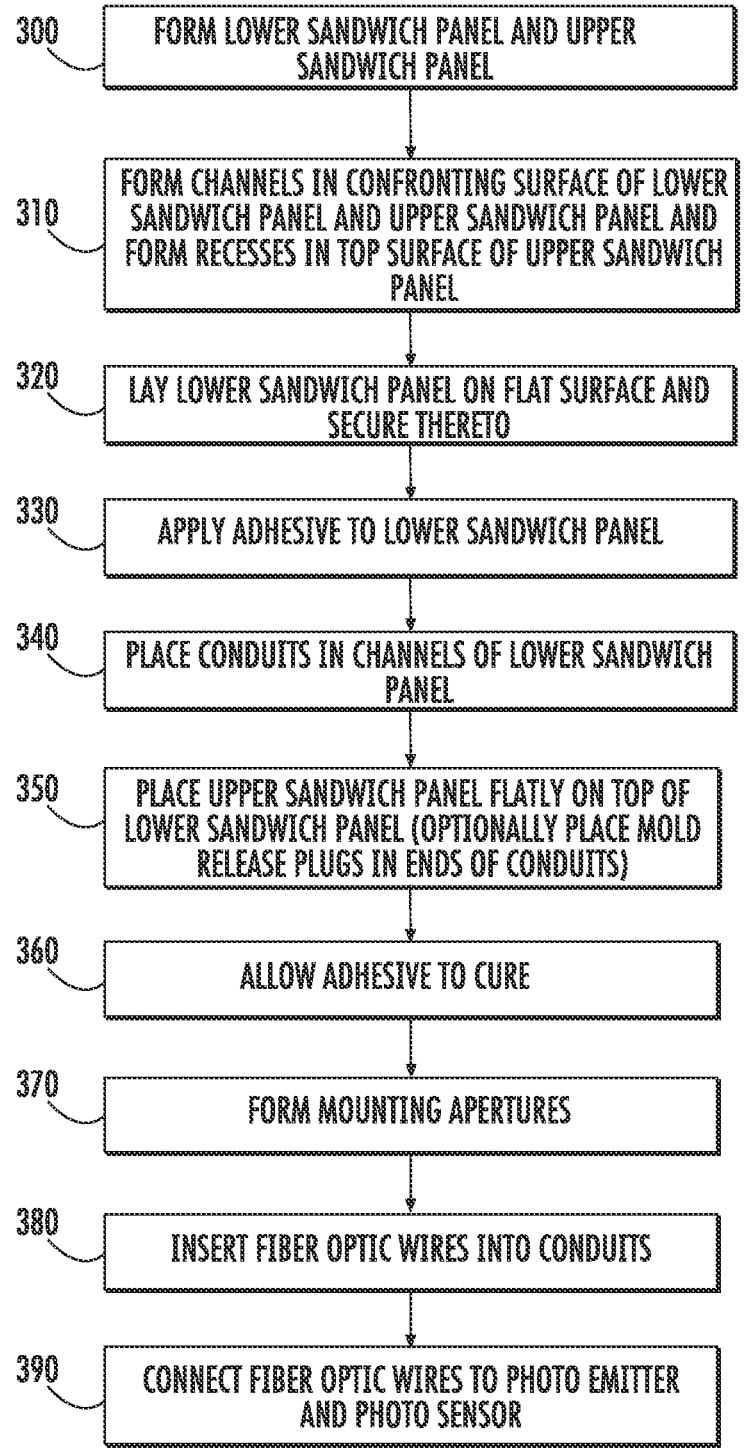
FIG. 8 is a flow diagram illustrating an exemplary method of making the composite end effector shown in FIG. 6.

Referring to FIG. 8, a flow diagram illustrating an exemplary method for constructing the end effector 210 in accordance with the present disclosure is shown. The method will now be described in detail in conjunction with the end effector 210 shown in FIGS. 6 and 7.

At step 300 of the exemplary method, the lower sandwich panel 226 and upper sandwich panel 228 may be cut or otherwise formed from one or more sheets of suitable material, such as CFC or aluminum. In one embodiment of the method, the sheets from which the lower sandwich panel 26 and upper sandwich panel 28 are cut may be formed of CFC sheets that are produced using a "vacuum-bagging" technique that may provide each of the lower sandwich panel 26 and upper sandwich panel 28 with a first, relatively rough side, and an second, relatively smooth side. The term "rough" is defined herein to mean one or more of uneven, irregular, not smooth, not flat, textured, pitted, etc. In other embodiments of the method, one or both of the lower sandwich panel 26 and upper sandwich panel 28 may be produced using processes which provide them with first and second sides that are both smooth.

At step 310 of the exemplary method, the channels 232a, 232b and 234a, 234b may be cut, milled, or otherwise formed in the confronting surfaces of the lower sandwich panel 226 and upper sandwich panel 228. The recesses 225 for holding effector pads may also be similarly formed in the top surface of the upper sandwich panel 228.

At step 320 of the exemplary method, the lower sandwich panel 226 may be laid on a flat surface, such as a table top, floor, or other flat work surface. In one embodiment of the method, the flat surface may be a bottom mold half 270 of a vacuum jig 272 as shown in FIG. 9. If the lower sandwich panel 226 has a rough first side and a smooth second side as described above, the lower sandwich panel 226 may be disposed on the flat surface with the smooth second side facing down and the rough first side facing up. The lower sandwich panel 226 may optionally be temporarily secured to the flat surface in a desired orientation, such as with tape and/or other fasteners or adhesives which, if using the vacuum jig 272, may seal the lower sandwich panel 226 to the bottom mold half 270 so that a vacuum can effectively be established therebetween. If a vacuum jig is not used, the sandwich panel 226 may be flatly secured to a flat surface using a temporary, secondary adhesive, such as any low-strength bonding agent, including, but not limited to, fugitive adhesive or pressure sensitive adhesive. Alternatively, it is contemplated that the lower sandwich panel 226 may be flatly secured to a flat surface using a film that is treated with a low-tack, pressure sensitive adhesive. Still further, it is contemplated that the lower sandwich panel 226 may be flatly secured to a flat surface using a primary adhesive of a reactive nature, such as a high-density, high-strength polyurethane foam consisting of two precursors. During curing, these precursors may react and increase in volume, thereby forcibly "sandwiching" the flatly-abutting lower sandwich panel 226 and upper sandwich panel 228 together and keeping them flat while they are bonded together as further described below.

At step 330 of the exemplary method, an amount of adhesive 274 may be applied to the lower sandwich panel 226. The adhesive 274 may be any appropriate adhesive, a non-limiting example of which is a flow-modified epoxy. At step 340 of the method, the conduits 230a, 230b may be seated within the respective channels 232a, 234a in the lower sandwich panel 226. In an alternative embodiment of the method, the adhesive 274 may be applied to the lower sandwich panel 226 after the conduits 230a, 230b are seated within the channels 232a, 234a.

At step 350 of the exemplary method, the upper sandwich panel 228 may be flatly placed on top of the adhesive-covered lower sandwich panel 226 with the channels 232b, 234b in the upper sandwich panel 228 fitting over and receiving the conduits 230a, 230b. Mold release plugs may be placed in the open ends of the conduits 230a, 230b to prevent the entry of adhesive during placement of the upper sandwich panel 228 and subsequent curing of the adhesive 274. Such plugs may be removed after the adhesive 274 has cured. If the lower sandwich panel 226 and the upper sandwich panel 228 each have a rough first side and a smooth second side as described above, the upper sandwich panel 228 may be placed on top of the lower sandwich panel 226 with the rough first side of the upper sandwich panel 228 facing down and with the smooth second side of the upper sandwich panel 228 facing up. The rough first sides of the lower sandwich panel 226 and upper sandwich panel 228 may thereby be disposed in a confronting relationship and separated by the adhesive 274.

In one embodiment of the method, the lower sandwich panel 226 and upper sandwich panel 228 may be stacked and adhered in the above-described manner using the vacuum jig 272 shown in FIG. 9. For example, the smooth second side of the lower sandwich panel 226 may be vacuum sealed flatly against the bottom mold half 270 of the vacuum jig 272 and the smooth second side of the upper sandwich panel 228 may be vacuum sealed flatly against the top mold half 276 of the vacuum jig 272. The top mold half 276 may then be inverted and lowered onto the bottom mold half 270.

At step 260 of the exemplary method, the adhesive 274 between the lower sandwich panel 226 and the upper sandwich panel 228 may be allowed to cure while the lower sandwich panel 226 and the upper sandwich panel 228 are held a short, fixed distance apart from one another, forming a so-called "bond-gap" therebetween that is mostly filled with adhesive, and with the outwardly-facing, non-confronting sides (e.g., the smooth second sides) of the lower sandwich panel 226 and the upper sandwich panel 228 held in a substantially parallel relationship with one another. In one embodiment, the lower sandwich panel 226 and the upper sandwich panel 228 may be held in this manner using the above-described jig 272. For example, with the lower sandwich panel 226 and the upper sandwich panel 228 vacuum sealed to the bottom and top mold halves 270, 276 and stacked so that the rough first sides of the lower sandwich panel 226 and the upper sandwich panel 228 are disposed in a confronting relationship as described above, one or more spacers or "gap blocks" of substantially identical height may be interposed between the bottom and top mold halves 270, 276. Such gap blocks may have a height that maintains the mold halves 270, 276 a specified, uniform distance apart so that the resulting end effector 210 has a desired predetermined thickness. Once the adhesive has cured, the conduits 230a, 230b may be securely fixed with the channels 232a, 232b, 234a, 234b.

Since the smooth second sides of the lower sandwich panel 226 and the upper sandwich panel 228 were held in a parallel relationship and the rough first sides of the lower sandwich panel 226 and the upper sandwich panel 228 were held apart from one another during curing of the adhesive 274, the end effector 210 may be highly planar (i.e., having parallel top and bottom surfaces), with any surface irregularities of the rough first sides of the lower sandwich panel 226 and the upper sandwich panel 228 having been "absorbed" by the adhesive 274 during curing. That is, the surface irregularities of the confronting, rough first sides may not affect the planarity of the end effector 210 as they otherwise might if the rough first sides were placed in direct contact with one another (i.e., with no bond-gap therebetween), with their respective surface irregularities engaging each other.

At step 370 of the method, the mounting apertures 224 may be cut, drilled, milled, or otherwise formed in the assembled lower sandwich panel 226 and upper sandwich panel 228. At step 380 of the exemplary method, the optical fibers 212a, 212b may be inserted into the conduits 230a, 230b, respectively.

At step 390 of the exemplary method, the optical fiber 212a may be connected to the photo emitter 213 and the optical fiber 212b may be connected to the photo sensor 215.

Owing to the high-planarity of the assembled lower sandwich panel 226 and upper sandwich panel 228, the completed end effector 210 may also be highly planar. Moreover, since the top and bottom surfaces of the end effector 210 may be formed of the smooth second sides of the upper sandwich panel 228 and lower sandwich panel 226, the major surfaces of the end effector 210 may be smooth and ultra-flat (e.g. less than about 0.005 inches of variation over about 24 inches of surface). Thus, the end effector 210 may be very light, very stiff, and not prone to generating, trapping, or distributing contaminants (i.e., particulate matter) during substrate handling processes. Moreover, since the optical fibers 212a, 212b and the conduits 230a, 230b are embedded within the end effector 210, the end effector 210 may have a slim profile and an exterior of the end effector 210 may be relatively smooth and regular, thus facilitating convenient and expeditious cleaning thereof.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The present disclosure is not to be limited in scope by the specific embodiments described herein. Indeed, various other embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A composite end effector comprising:
   a lower sandwich panel having a first side and a second side opposite the first side;
   an upper sandwich panel having a first side and a second side opposite the first side, wherein the first side of the upper sandwich panel is bonded to the first side of the lower sandwich panel;
   an electrical conductor disposed between the first side of the lower sandwich panel and the first side of the upper sandwich panel; and
   an electrostatic chuck is electrically coupled to the electrical conductor through an aperture in the upper sandwich panel.

2. The composite end effector of claim 1, further comprising an electrical connector disposed intermediate the electrical conductor and the electrostatic chuck for electrically coupling the electrical conductor to the electrostatic chuck.

3. The composite end effector of claim 1, wherein the electrical conductor is embedded within a layer of adhesive intermediate the lower sandwich panel and the upper sandwich panel.

4. The composite end effector of claim 1, wherein the electrostatic chuck is mechanically fastened to at least one of the upper sandwich panel and the lower sandwich panel.

5. A composite end effector comprising:
   a lower sandwich panel having a first side and a second side opposite the first side;
   an upper sandwich panel having a first side and a second side opposite the first side, wherein the first side of the upper sandwich panel is bonded to the first side of the lower sandwich panel;
   a pair of channels formed in at least one of the first side of the upper sandwich panel and the first side of the lower sandwich panel;
   conduits disposed within the channels; and
   optical fibers disposed within the conduits.

6. The composite end effector of claim 5, wherein the conduits are at least partially embedded within a layer of adhesive intermediate the lower sandwich panel and the upper sandwich panel.

7. The composite end effector of claim 5, wherein a first of the optical fibers is connected to a photo emitter and a second of the optical fibers is connected to a photo sensor.

8. The composite end effector of claim 5, wherein the channels extend along an entire length of at least one of the first side of the upper sandwich panel and the first side of the lower sandwich panel.

9. A method of making a composite end effector, the method comprising:
   forming a lower sandwich panel from a first sheet of material, the lower sandwich panel having a first side and a second side opposite the first side;
   forming an upper sandwich panel from a second sheet of material, the upper sandwich panel having a first side and a second side opposite the first side;
   disposing an electrical conductor between the first side of the lower sandwich panel and the first side of the upper sandwich panel;
   bonding the first side of the lower sandwich panel to the first side of the upper sandwich panel;
   forming an aperture in the upper sandwich panel;
   mounting an electrostatic chuck in the aperture; and
   coupling the electrostatic chuck to the electrical conductor through the aperture.

10. The method claim 9, further comprising disposing an electrical connector intermediate the electrostatic chuck and the electrical conductor.

11. The method claim 9, further comprising fastening the electrostatic chuck to at least one of the lower sandwich panel and the upper sandwich panel.

12. A method of making a composite end effector, the method comprising:
   forming a lower sandwich panel from a first sheet of material, the lower sandwich panel having a first side and a second side opposite the first side;
   forming an upper sandwich panel from a second sheet of material, the upper sandwich panel having a first side and a second side opposite the first side;
   forming a first channel in at least one of the first side of the lower sandwich panel and the first side of the upper sandwich panel; and
   disposing a conduit within the channel
   inserting an optical fiber into the conduit.

13. The method of claim 12, further comprising connecting the optical fiber to one of a photo emitter and a photo sensor.

* * * * *